(12) United States Patent
Wong

(10) Patent No.: US 7,802,020 B2
(45) Date of Patent: Sep. 21, 2010

(54) I/O MODULE WITH CONFIGURABLE ASICS THAT INCLUDE A MATRIX SWITCH

(75) Inventor: King Wai Wong, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 935 days.

(21) Appl. No.: 11/609,753

(22) Filed: Dec. 12, 2006

(65) Prior Publication Data

US 2008/0112140 A1    May 15, 2008

Related U.S. Application Data

(63) Continuation-in-part of application No. 11/595,045, filed on Nov. 9, 2006.

(51) Int. Cl.
G06F 3/00 (2006.01)
G06F 13/38 (2006.01)
G06F 15/177 (2006.01)

(52) U.S. Cl. .............. 710/8; 710/10; 710/62; 710/74; 709/220; 709/221; 709/222

(58) Field of Classification Search ............ None
See application file for complete search history.

(56) References Cited

U.S. PATENT DOCUMENTS

| | | | |
|---|---|---|---|
| 5,452,201 A | 9/1995 | Pieronek et al. | |
| 5,491,531 A | 2/1996 | Adams et al. | |
| 5,617,060 A | 4/1997 | Wilson et al. | |
| 5,966,519 A | 10/1999 | Keeley | |
| 6,535,926 B1 | 3/2003 | Esker | |
| 6,681,261 B2 * | 1/2004 | Mancusi et al. | 709/250 |
| 6,744,274 B1 * | 6/2004 | Arnold et al. | 326/16 |
| 6,795,624 B2 * | 9/2004 | Wickman et al. | 385/52 |
| 7,039,748 B2 * | 5/2006 | Brescia, Jr. | 710/313 |
| 2004/0049550 A1 | 3/2004 | Yu | |
| 2004/0100650 A1 | 5/2004 | Landue et al. | |
| 2004/0255069 A1 * | 12/2004 | Brescia, Jr. | 710/305 |
| 2006/0066363 A1 | 3/2006 | Ho | |
| 2006/0119385 A1 | 6/2006 | Balasubramanian et al. | |
| 2007/0098118 A1 | 5/2007 | Muhammad et al. | |
| 2007/0223382 A1 * | 9/2007 | Crabtree et al. | 370/236 |
| 2008/0313381 A1 * | 12/2008 | Leigh et al. | 710/313 |

OTHER PUBLICATIONS

US Digital, "32 Bit Digital I/O USB Device", Vancouver, WA, (Oct. 25, 2006),1-2.

(Continued)

*Primary Examiner*—Henry W Tsai
*Assistant Examiner*—Michael Sun

(57) ABSTRACT

An I/O module for use with I/O devices such as pumps, valves, thermocouples, and mass flow controllers includes an application-specific integrated circuit (ASIC) associated with each electrical signal interface to an I/O device. Additionally, a matrix switch is incorporated into each of the ASICs in order to enable electrical signals related to the I/O device to be distributed between the ASICs. Matrix switches within the different ASICs are electrically connected by at least one signal path that is dedicated to electrical signal distribution within the I/O module and the matrix switches are configurable on an ASIC-by-ASIC basis such that the desired electrical signal distribution can be achieved on a per-application basis. Incorporating configurable matrix switches into the ASICs enables electrical signals to be easily distributed among the ASICs in an I/O module.

14 Claims, 15 Drawing Sheets

OTHER PUBLICATIONS

Rahul Kulkarni, "National Instruments Announces Cyclone FPGA-Based Digital I/O Products Ideal for Industrial Measurement & Control Applications", 2004, Altera Corporation, News & Views, p. 32-33.

O'Connor, P. "Amplitude and time measurement ASIC with analog derandomization", 2001, Brookhaven National Laboratory, Upton, NY.

* cited by examiner

Configuration Interface — 156

- I/O Device Type: valve
- I/O Device Name: < device name >
- Pin Settings:
  - Signal: < pin number >
  - Return: < pin number >
- Signal State:
  - ON: < state name >
  - OFF: < state name >
- Voltage: < 24v/12v/5v >

FIG.4

Monitoring and Control Interface — 158

< I/O Device Name >
- Current State: < state name > — 160
- Change State: < select new state > — 162

FIG.5

Configuration Interface — 164

- I/O Device Type: fluid flow sensor
- I/O Device Name: < device name >
- Pin Settings: < pin number > / < pin number >
- Engineering Unit: < engineering unit >
- Scale: < value >
- Offset: < value >
- Voltage: < 24v/12v/5v >

FIG.6

Monitoring Interface — 166

< I/O Device Name >

Flow rate: 1.52 liter/sec

FIG.7

I/O MODULE WITH CONFIGURABLE ASICS THAT INCLUDE A MATRIX SWITCH

CROSS-REFERENCE TO RELATED APPLICATION

This application is a continuation-in-part of previously filed and co-pending patent application Ser. No. 11/595,045, filed 9 Nov. 2006.

BACKGROUND OF THE INVENTION

Devices that provide electrical signal outputs and/or are controlled by electrical signal inputs are referred to generally as input/output (I/O) devices. Typical I/O devices used in industrial applications include pumps, valves, mass flow controllers, and thermocouples. I/O devices used in industrial applications are usually accompanied by an I/O module, which converts electrical signals into raw digital or analog values when functioning as an input module and converts digital or analog values into electrical control signals when functioning as an output module. Raw digital and/or analog values are usually interpreted by remotely hosted software into meaningful outputs, such as for example, the state of a pump or valve, the flow rate of a liquid, or the temperature of an environment. The remotely hosted software must be programmed with specific knowledge of the I/O device and the I/O module to enable monitoring and control of the I/O device.

Conventional I/O modules are designed specifically for a particular I/O application. For example, application-specific I/O modules include analog input modules, analog output modules, digital input modules, and digital output modules. Because I/O modules are designed for specific applications, different types of I/O modules are often needed for each different type of I/O device that is used. In complex industrial applications with many different types of I/O devices in use, many different types of I/O modules may be needed.

In view of this, what is needed is an I/O module that can be configured on a per-application basis to support different types of I/O devices.

SUMMARY OF THE INVENTION

An I/O module for use with I/O devices such as pumps, valves, thermocouples, and mass flow controllers includes an application-specific integrated circuit (ASIC) associated with each electrical signal interface to an I/O device. Additionally, a matrix switch is incorporated into each of the ASICs in order to enable electrical signals related to the I/O device to be distributed between the ASICs. Matrix switches within the different ASICs are electrically connected by at least one signal path that is dedicated to electrical signal distribution within the I/O module and the matrix switches are configurable on an ASIC-by-ASIC basis such that the desired electrical signal distribution can be achieved on a per-application basis. Incorporating configurable matrix switches into the ASICs enables electrical signals to be easily distributed among the ASICs in an I/O module.

In an embodiment, the matrix switch within each ASIC is configured via the same serial interface that is used to configure signal processing circuitry within the ASIC. Because the matrix switches are configured via the same serial interfaces, no additional configuration interfaces need to be added to the ASICs to facilitate configuration of the matrix switches.

In another embodiment, the I/O module includes I/O interface software pre-programmed within the I/O module. The pre-programmed I/O interface software enables a user to remotely configure the I/O module, including the matrix switches within the ASICs, to support an I/O device by selecting an I/O device from a menu of pre-programmed I/O devices. Once an I/O device is selected and the I/O module is configured to support the selected I/O device, a user can utilize pre-programmed interfaces to remotely monitor a parameter of the I/O device and to control the operation of the I/O device, e.g., through manual commands or through a process control loop. Because the I/O module includes configuration, monitoring, and control capability pre-programmed within the I/O module, no additional I/O software is required to configure an I/O module to support a connected I/O device, to begin monitoring a parameter of the connected I/O device, and/or to control a parameter of the connected I/O device. The I/O module can be configured using a simple menu driven interface without the need for an end user to develop device-specific software code. Further, the configuration, monitoring, and control interfaces of the I/O module can be accessed remotely via a well known network connection such as an Ethernet connection and through a well known interface such as a web browser.

In an embodiment, the I/O module is pre-programmed with configuration, monitoring, and control interface modules for multiple different types of I/O devices. Through the corresponding configuration, monitoring, and control interface modules, a user can remotely configure the I/O module to support whichever type of I/O device the I/O module is connected to. Because the I/O module is pre-programmed to support multiple different types of I/O devices, the same type of I/O module can be used to support many different types of I/O devices. Additionally, a single I/O module can be configured to support multiple different I/O devices in parallel.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIG. 4 depicts an exemplary configuration interface that provides additional configuration parameters that are specific to the selected I/O device.

FIG. 5 depicts exemplary monitoring and control interfaces for an I/O device such as a valve.

FIG. 6 depicts an example of a configuration interface for a fluid flow sensor that is pre-programmed into the I/O module of FIG. 1.

FIG. 7 depicts an exemplary monitoring interface for the fluid flow sensor of FIG. 6.

Throughout the description similar reference numbers may be used to identify similar elements.

DETAILED DESCRIPTION OF THE INVENTION

Figure 1:
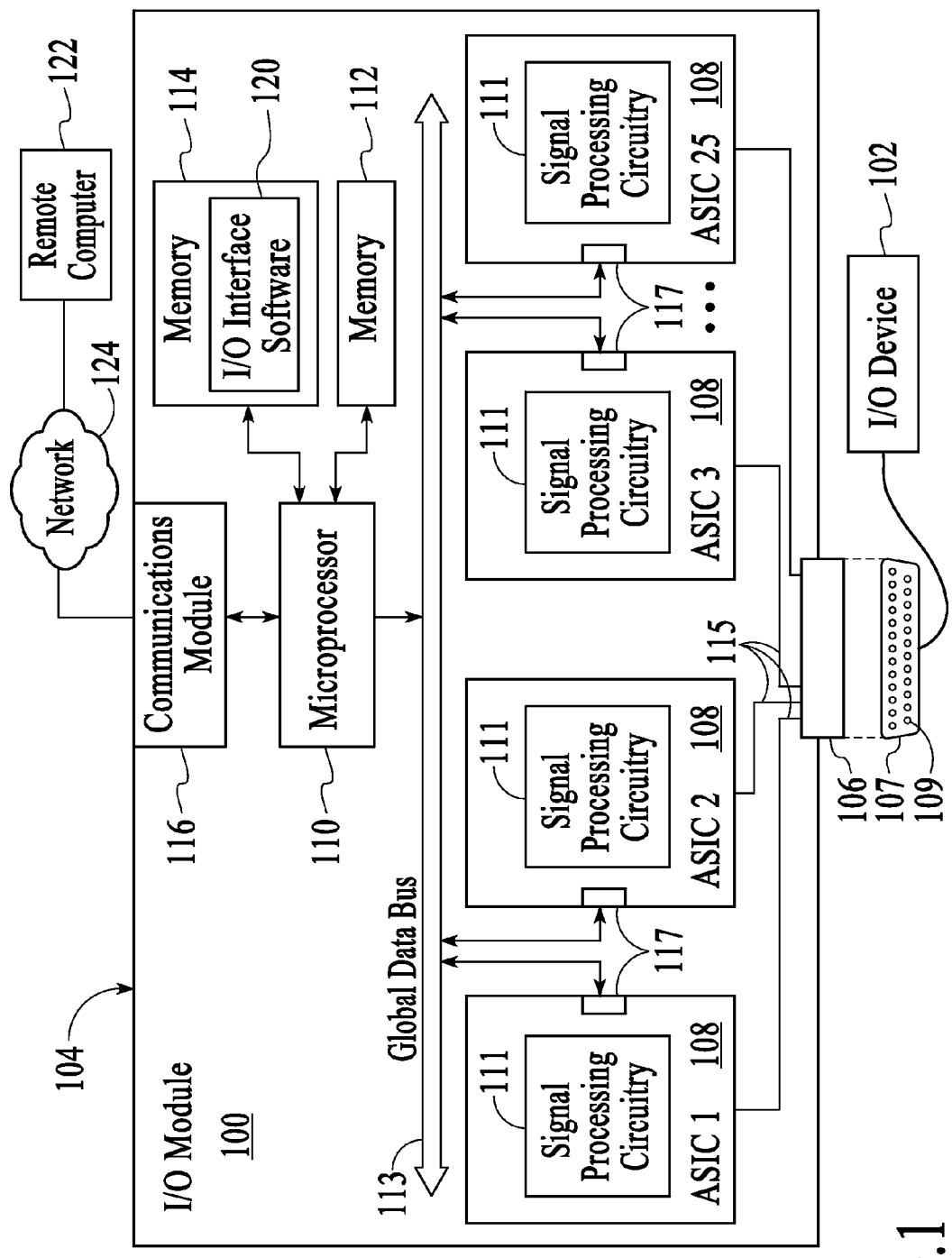
FIG. 1 depicts an embodiment of an I/O module that can be programmed to be used with different types of I/O devices.

FIG. 1 depicts an embodiment of an I/O module 100 that can be programmed to be used with different types of I/O devices 102. An I/O module is often referred to as an input module when it receives electrical signals from an I/O device and as an output module when it provides electrical signals to an I/O device. The term "I/O" is used generally to refer to a device that includes input and/or output functionality. The I/O module depicted in FIG. 1 includes a housing 104, an electrical connector 106, application-specific integrated circuits (ASICs) 108, a microprocessor 110, memory 112 and 114, and a communications module 116.

The electrical connector 106 is an interface that enables an electrical signal connection to be made between an I/O device 102 and the I/O module 100. The electrical connector is typically a connector such as a D-subminiature or "D-sub" connector 107. D-sub connectors typically include two or more parallel rows of electrical signal interfaces 109, in the form of, for example, pins or sockets, which are surrounded by a "D" shaped metal shield. Exemplary D-sub connectors include DA-15, DB-25, DC-37, DD-50, and DE-9 connectors, having 15, 25, 37, 50, and 9 pins, respectively. D-sub connectors are well-known in the field of I/O devices. Although D-sub connectors are described, other types of electrical connectors, including terminal blocks, plug and socket connectors, RS-232 connectors, and RS-422/485 connectors, can be used.

The housing 104 of the I/O module 100 contains the ASICs 108, the microprocessor 110, the memory 112 and 114 and the communications module 116. The housing may be, for example, a plastic or metal shell that encases the ASICs, the microprocessor, the memory, and the communications module.

The ASICs 108 within the housing of the I/O module process signals that are received from and/or provided to an I/O device 102. In the embodiment of FIG. 1, each ASIC includes signal processing circuitry 111 and is connected to one pin 109 of the electrical connector 106 by an electrical signal path 115. When the I/O module is functioning as an input module, the ASICs convert input electrical signals (e.g., either a voltage or current) into a digital or analog value (e.g., a digital output or a voltage/current measurement). The conversion of an electrical signal from an I/O device to a digital or analog value is accomplished through the signal processing circuitry and is well known in the field of I/O devices and I/O modules. The digital or analog value, which is generated by the ASIC, is then provided to the microprocessor 110 via a global data bus 113 for further processing as described below.

When the I/O module 100 is functioning as an output module, the ASICs 108 convert information received from the microprocessor 110 into electrical signals that are used to control the corresponding I/O device 102. For example, an ASIC converts digital or analog values into an electrical signal of a particular voltage or current that is used to control an I/O device. The conversion of digital or analog values to electrical signals to control an I/O device is accomplished through the signal processing circuitry 111 and is well known in the field of I/O devices and I/O modules. The electrical signals generated by the ASICs are provided to the I/O devices via the electrical connectors and are used to control the corresponding I/O device.

In the embodiment of FIG. 1, the ASICs 108 are configurable devices. In particular, the ASICs can be configured to perform various different digital and/or analog I/O signal conversions. Additionally, the ASICs are configurable to correspond with different signal levels (e.g., low signal levels in the millivolt range or high signal levels in the volt range, e.g., up to 24V) and/or to correspond with different types of signals (e.g., single-ended and/or differential in/out signals). The configurability of the ASICs is one aspect of the I/O module 100 that enables the same type of I/O module to support many different types of I/O devices. In the embodiment of FIG. 1, each ASIC includes a communications interface 117, such as a serial interface, which enables data communication between the ASICs and the microprocessor 110.

The I/O module 100 depicted in FIG. 1 includes multiple ASICs 108, with each ASIC supporting one electrical signal interface (e.g., one pin). The existence of multiple ASICs enables the I/O module to support multiple different I/O devices in parallel and/or multiple electrical signal connections between a single I/O device and the I/O module. An example of the I/O module supporting two different I/O devices in parallel is described below.

The microprocessor 110 within the housing 104 of the I/O module 100 may include a multifunction microprocessor and/or an application specific microprocessor that is operationally connected to the memory. In an embodiment, the microprocessor executes computer readable program code and runs a real-time operating system such as Linux, WINDOWS CE, ITRON, VxWORKS, or Micro-C/OS-II. Although some examples of real-time operating systems are provided, other operating system software can be used in conjunction with the microprocessor.

The memory 112 and 114 within the housing 104 of the I/O module 100 may include non-volatile memory 112 such as electrically erasable programmable read only memory (EEPROM) or flash memory and volatile memory 114 such as random access memory (RAM). Operating system code and other pre-programmed computer readable program code are typically stored in the non-volatile memory while data generated and used during operation of the I/O module is typically stored in the volatile memory. Although the microprocessor and memory are depicted as separate functional units, in some instances, the microprocessor and memory are integrated onto the same device and typically the microprocessor will include some on-chip memory. In an embodiment, there may be more than one discrete microprocessor unit and more than two memory units in the I/O module. As indicated in FIG. 1, the memory also includes I/O interface software 120 that enables the I/O module to operate as described below.

The communications module 116 within the housing 104 of the I/O module 100 enables the I/O module to communicate with a remote computer 122. For example, the communications module supports a well known network communications protocol such as Ethernet, which allows protocol data units (e.g., Ethernet packets) to be exchanged between the I/O module 100 and the remote computer via a network 124, e.g., a local area network (LAN), a wide are network (WAN), a backbone network, etc. In an embodiment, the Ethernet-compatible communications module is incorporated into the microprocessor.

In accordance with an embodiment of the invention, the I/O interface software 120 resident within the I/O module 100 allows a user to remotely configure the I/O module to support an I/O device 102 by selecting an I/O device from a menu of pre-programmed I/O devices. Once an I/O device is selected and the I/O module is configured to support the selected I/O device, a user can utilize pre-programmed software to remotely monitor a parameter of the I/O device and to control the operation of the I/O device, e.g., through manual commands or through a process control loop. Because the I/O module includes configuration, monitoring, and control capability pre-programmed within the I/O module, no additional I/O software is required to get an I/O module configured, to begin monitoring a parameter of the I/O device, and/or to control a parameter of the I/O device. The I/O module can be configured using a simple menu driven interface without the need to develop device-specific software code. Further, the configuration, monitoring, and control interfaces of the I/O module can be accessed remotely via a well known network connection such as an Ethernet connection and through a well known interface such as a web browser.

In an embodiment, the I/O module 100 is pre-programmed with configuration, monitoring, and control interface modules for multiple different types of I/O devices 102. Through the corresponding configuration, monitoring, and control interface modules, a user can remotely configure the I/O module to support whichever type of I/O device the I/O module is connected to. Because the I/O module is pre-programmed to support multiple different I/O devices, the same type of I/O module can be used to support many different types of I/O devices. Additionally, a single I/O module can be configured to support multiple different I/O devices in parallel.

Figure 2:
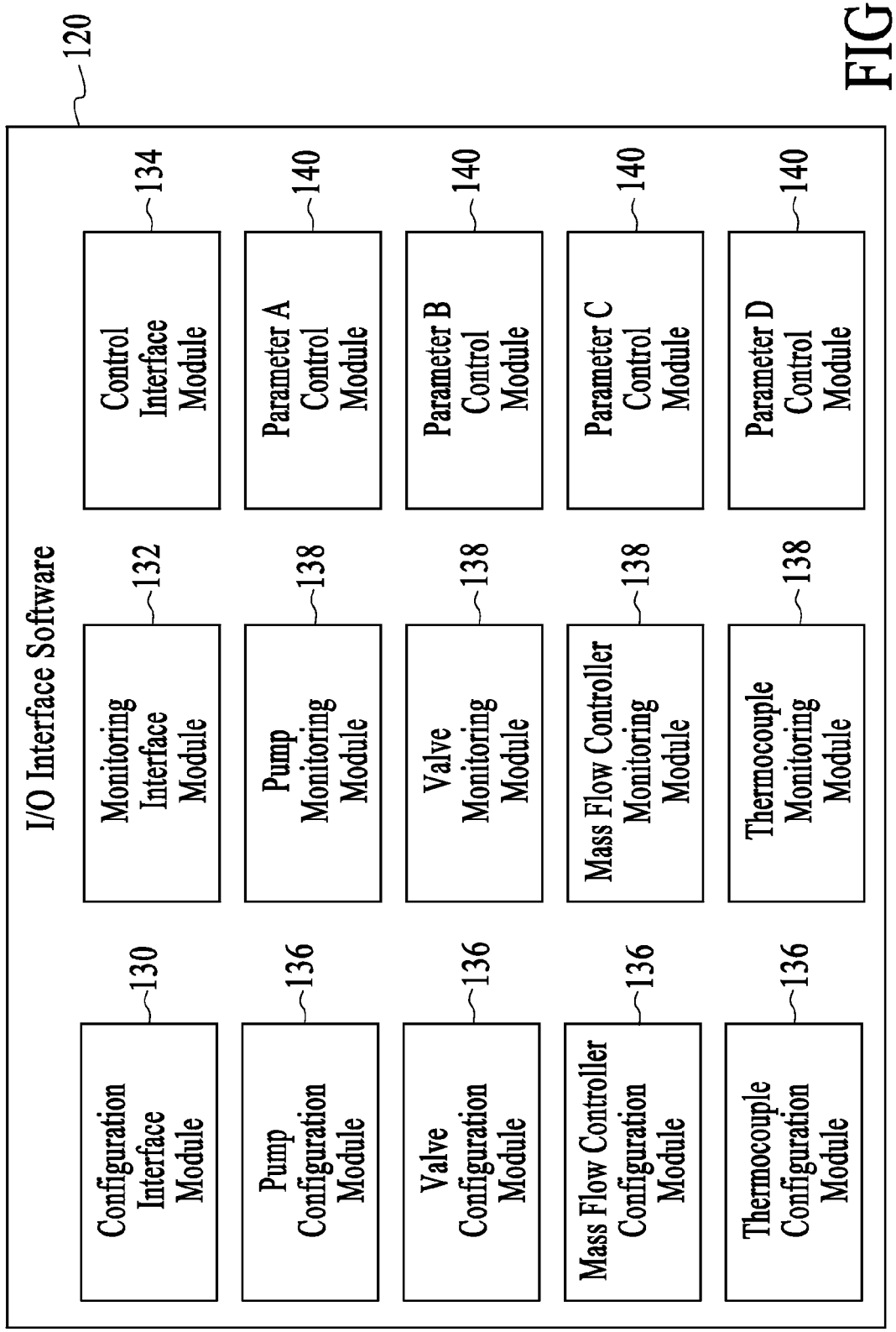
FIG. 2 is a functional block diagram of an embodiment of I/O interface software that is pre-programmed into the I/O module of FIG. 1.

As described above, the I/O module 100 is pre-programmed with I/O interface software 120 that enables configuration of an I/O module, monitoring of a connected I/O device, and control of a connected I/O device. FIG. 2 is a functional block diagram of an embodiment of the I/O interface software 120 that is pre-programmed into the I/O module of FIG. 1. The I/O interface software includes a configuration interface module 130, a monitoring interface module 132, a control interface module 134, and various device-specific and parameter-specific modules 136, 138, and 140. The configuration interface module includes computer readable program code that provides configuration functionality for the I/O module. In particular, the configuration interface module provides a configuration user interface that enables a user to select an I/O device from a menu of I/O devices that are supported by the I/O module. The configuration interface module is also associated with configuration modules that are specific to configuring the I/O module to correspond to a selected I/O device. For example, device-specific configuration modules 136 such as a pump configuration module, a valve configuration module, a mass flow controller configuration module, and a thermocouple configuration module are pre-programmed as part of the I/O interface software. Each device-specific configuration module includes computer readable program code that is specific to configuring the I/O module to support a specific type of I/O device. Configuration operations that are accomplished via the device-specific configuration modules include, but are not limited to:

1) identification of the pins to which an I/O device is connected;

2) configuration of the ASICs. In an embodiment, the ASICs are configured through configuration commands that are sent from the microprocessor via a bus communications protocol such as the serial peripheral interface (SPI) protocol;

3) configuration of signal paths within the I/O module;

4) loading of translation code that is responsible for translating digital and/or analog values to meaningful outputs (e.g., translating a digital "1" to the meaningful output "valve open") or translating a meaningful input to a digital or analog value (e.g., translating the command "close valve" to a digital "0"); and 5) loading of various graphical user interfaces, such as configuration, monitoring, and control graphical user interfaces.

The monitoring interface module 132 includes computer readable program code that provides monitoring functionality through the I/O module 100. In particular, the monitoring interface module provides a monitoring user interface that enables a parameter of an I/O device 102 to be monitored from a remote computer 122. For example, monitoring of an I/O device may include monitoring the status of a pump (on/off) or a valve (open/closed), monitoring the current temperature of an environment in which a thermocouple is present, or monitoring the flow rate of a mass flow controller. In the embodiment of FIG. 2, the monitoring interface module is associated with monitoring modules that are specific to monitoring a particular type of I/O device. For example, device-specific monitoring modules 138 such as a pump monitoring module, a valve monitoring module, a mass flow controller monitoring module, and a thermocouple monitoring module are pre-programmed as part of the I/O interface software. Each device-specific module includes program code that is pre-programmed into the I/O module to enable monitoring of the I/O device to be set up through a simple graphical user interface and without having to write new program code.

The control interface module 134 includes computer readable program code that provides control functionality through the I/O module 100. In particular, the control interface module provides a control user interface that enables a parameter of a supported I/O device to be controlled. Control of the I/O device may include, for example, manual control of the I/O device via user commands entered by a user at a remote computer, automatic control through a control routine hosted at a remote computer, or automatic control via a control routine that is pre-programmed within the I/O module. In an embodiment, controlling an I/O device through the I/O interface software within the I/O module includes turning on or off a pump, opening or closing a valve, or changing the setting of a mass flow controller. In the embodiment of FIG. 2, the control interface module includes control modules 140 that are specific to controlling a particular parameter. For example, parameter-specific control modules for various different parameters (e.g., parameters A, B, C, and D) are pre-programmed as part of the I/O interface software.

Although the I/O interface software 120 is depicted as having various different separate software modules 130-140, it should be understood that the computer readable program code associated with these software modules can be integrated and/or interconnected in many different ways that are known in the field of software development. For example, configuration, monitoring, and/or control software code related to a particular type of I/O device may be integrated into a device-specific software module. The particular organization of the I/O interface software within the I/O module is not critical to the invention.

An I/O module as described above can be configured by remotely accessing the configuration interface module that is pre-programmed into the I/O module, where remote access involves utilizing a network communications protocol to communicate between the I/O module and the remote computer. Further, an I/O device that is connected to the I/O module can be remotely monitored and/or remotely controlled by accessing the monitoring and control interface modules that are pre-programmed into the I/O module. Examples of configuration, monitoring, and control operations performed via the I/O module and I/O interface software of FIGS. 1 and 2 are described below with reference to FIGS. 3-9.

Figure 3:
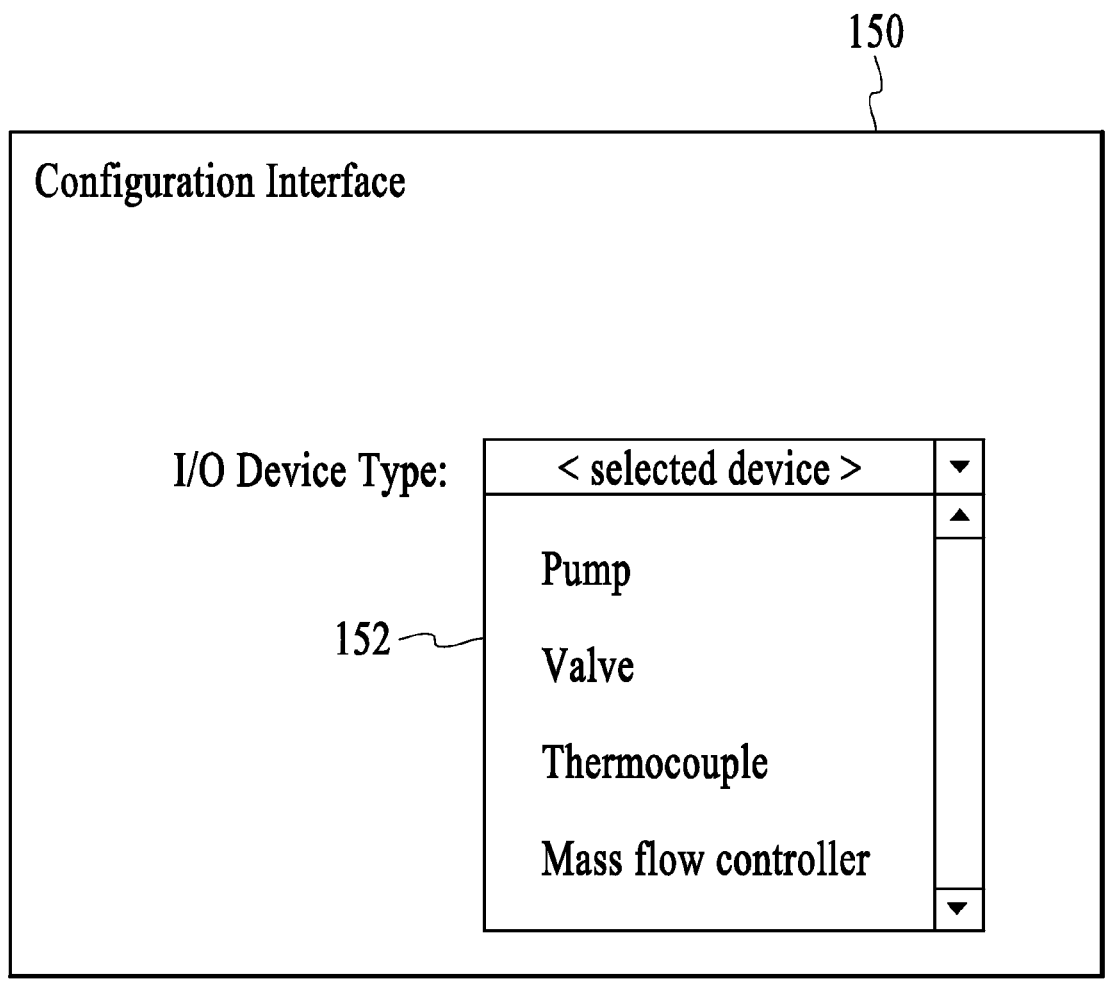
FIG. 3 depicts an example of a configuration interface that is supported by the I/O module of FIG. 1.

FIG. 3 depicts an example of a configuration interface 150 that is supported by the I/O module 100. In the example, the configuration interface, which is pre-programmed within the I/O module, is accessed via a remote computer through a network connection and a web browser. The configuration interface provides a menu 152 of I/O devices to select from. The I/O devices in the "I/O device type" menu represent different types of I/O devices for which pre-programmed configuration modules exist. In the example of FIG. 3, the menu of devices for which pre-programmed configurations exist includes a pump, a valve, a thermocouple, and a mass flow controller. The act of selecting one of the I/O devices in the menu initiates a process to configure the I/O module to correspond to the selected I/O device. In particular, selection of one of the I/O devices triggers the execution of a device-specific configuration module. In one embodiment, the I/O module is completely configured in response to the device selection while in other embodiments, the selection of a device triggers additional configuration parameters which are presented through a graphical user interface. For example, configuration parameters may include identifying the pins of the I/O module to which the I/O device is connected, selecting signal characteristics, naming device states, etc.

FIG. 4 depicts an exemplary configuration interface 156 that provides configuration parameters that are specific to the selected I/O device (e.g., a valve). The configuration parameters are pre-programmed into the I/O module and include:

1) I/O device name—an I/O device name that can be arbitrarily assigned to the I/O device on an application-specific basis;

2) pin settings—an identification of the pins to which the I/O device is connected. For example, the valve has two connections to the I/O module, a "signal" connection at a first pin and a "return" connection at a second pin. Through the selection menu, a user identifies the pin numbers of the pins to which the I/O device is connected;

3) signal state—the valve has two states and in this instance the states can be given application-specific names. For example, the "on" state of the valve can be named "opened" while the "off" state of the valve can be named "closed"; and 4) voltage—the voltage of the electrical signal that is expected from the I/O device and/or used to control the I/O device is identified. In this embodiment, the voltage is selected from a menu of expected voltages.

Although an exemplary configuration interface 156 is described with reference to FIG. 4, the particular configuration parameters provided in a configuration interface are device-specific. Further, although a particular type of graphical user interface is depicted, the exact type of graphical user interface used to present the configuration parameters is not critical. The critical aspect of the configuration interface is that the configuration parameters are pre-programmed within the I/O module and presented to a user that desires to configure the I/O module to correspond to a particular I/O device.

Once an I/O module is configured to support a particular I/O device, the monitoring and/or control interface modules 132, 134 (FIG. 2) can be used to monitor and/or control the I/O device to which the I/O module is connected. FIG. 5 depicts exemplary monitoring and control interface 158 for an I/O device such as a valve. In the example of FIG. 5, the current state of the valve is monitored through a monitoring interface 160 and the current state of the valve is identified as either "opened" or "closed." The state of the valve is controlled through a control interface 162 and the state of the valve can be changed from "opened" to "closed" or from "closed" to "opened." Although exemplary monitoring and control parameters are described with reference to FIG. 5, the particular monitoring and control parameters are device specific. Further, although the monitoring and control interfaces are presented in a particular manner, other techniques for presenting monitoring and control parameters are contemplated. For example, the monitoring and control interfaces can be presented at a remote computer as graphical images of dials, buttons, graphs, charts, tickers, etc.

The exemplary configuration, monitoring, and control interfaces described with reference to FIGS. 3-5 relate to a valve that has two states, "opened" or "closed." As stated above, the I/O module can be configured to support various different types of I/O devices. FIG. 6 depicts an example of a configuration interface 164 for a fluid flow sensor that is also pre-programmed into the I/O module. The configuration interface of FIG. 6 includes some configuration parameters that are similar to the valve, e.g., "I/O device name," "pin settings," and "voltage." However, the configuration interface also includes configuration parameters such as "engineering unit," "scale," and "offset," which are specific to the fluid flow sensor. Again, although an exemplary configuration interface is described with reference to FIG. 6, the particular configuration parameters provided in a configuration interface are device-specific. Further, although a particular type of graphical user interface is depicted, the exact type of graphical user interface used to present the configuration parameters is not critical. The critical aspect of the configuration interface is that the configuration parameters are pre-programmed within the I/O module and presented to a user that desires to configure the I/O module to correspond to a particular I/O device.

FIG. 7 depicts an exemplary monitoring interface 166 for the fluid flow sensor of FIG. 6. In the example of FIG. 7, the flow rate measured by the fluid flow sensor is presented in engineering units such as liters per second. In this example, the flow rate is determined by converting an electrical signal (voltage or current) from the I/O device into an analog value and then translating the analog value to a flow rate in liters per second, where both the converting and translating are done at the I/O module itself. That is, the I/O module translates analog or digital values into meaningful outputs (e.g., a reading in liters per second). Again, although an exemplary monitoring parameter is described with reference to FIG. 7, the particular monitoring and/or control parameters are device specific. Further, although the monitoring interface is presented in a particular manner, other techniques for presenting monitoring and control parameters are contemplated. For example, the monitoring and control interfaces can be presented as graphical images of dials, buttons, graphs, charts, tickers, etc.

In addition to basic control functions such as controlling a valve to open or close, the control interface of the I/O module 100 can be pre-programmed to support more advanced control techniques. For example, the control interface of the I/O module can be pre-programmed to support process loop control with, for example, proportional-integral-derivative (PID) tuning. In an embodiment, a process loop control interface, such as a temperature control interface, presents various control parameters for configuration. For example, the temperature control interface may prompt a user to specify the desired temperature, the loop control method, and a control parameter such as a PID value. Interfaces for other process loop controls may present other configuration parameters.

Figure 8:
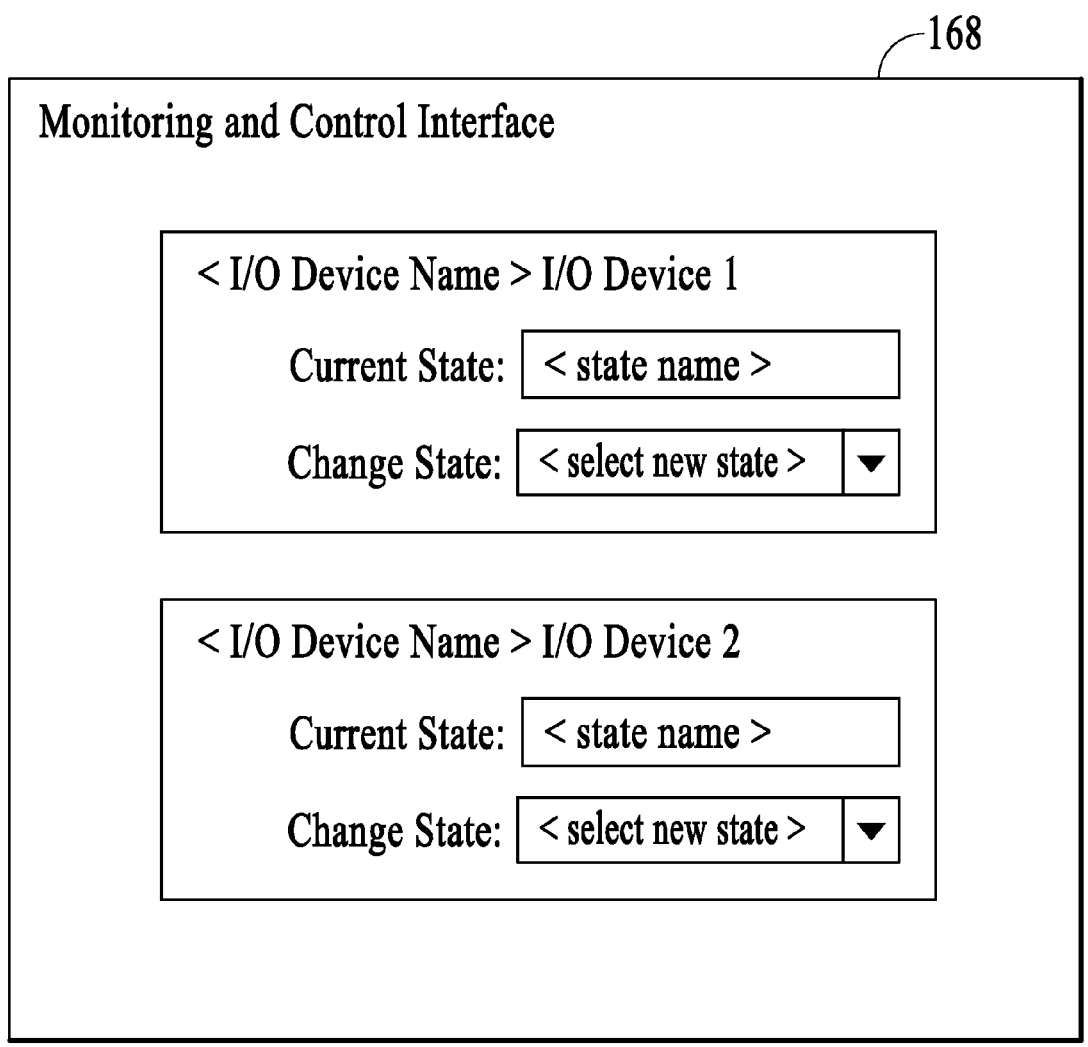
FIG. 8 depicts an exemplary monitoring and control interface of an I/O module in which two different I/O devices are monitored and controlled in parallel.

In an embodiment, the I/O module 100 described with reference to FIGS. 1 and 2 can support multiple I/O devices 102 in parallel. In an embodiment, a configuration operation is performed for each supported I/O device. Once the I/O module is configured to support multiple I/O devices in parallel, the monitoring and control interface modules 132 and 134 pre-programmed into the I/O module can be used to monitor and/or control multiple devices in parallel. FIG. 8 depicts an exemplary monitoring and control interface 168 in which two different I/O devices are monitored and controlled in parallel. The monitoring and control interface for the two different I/O devices can be presented to a user on the same screen of a remote computer or on separate screens that can be called up on command.

Figure 9:
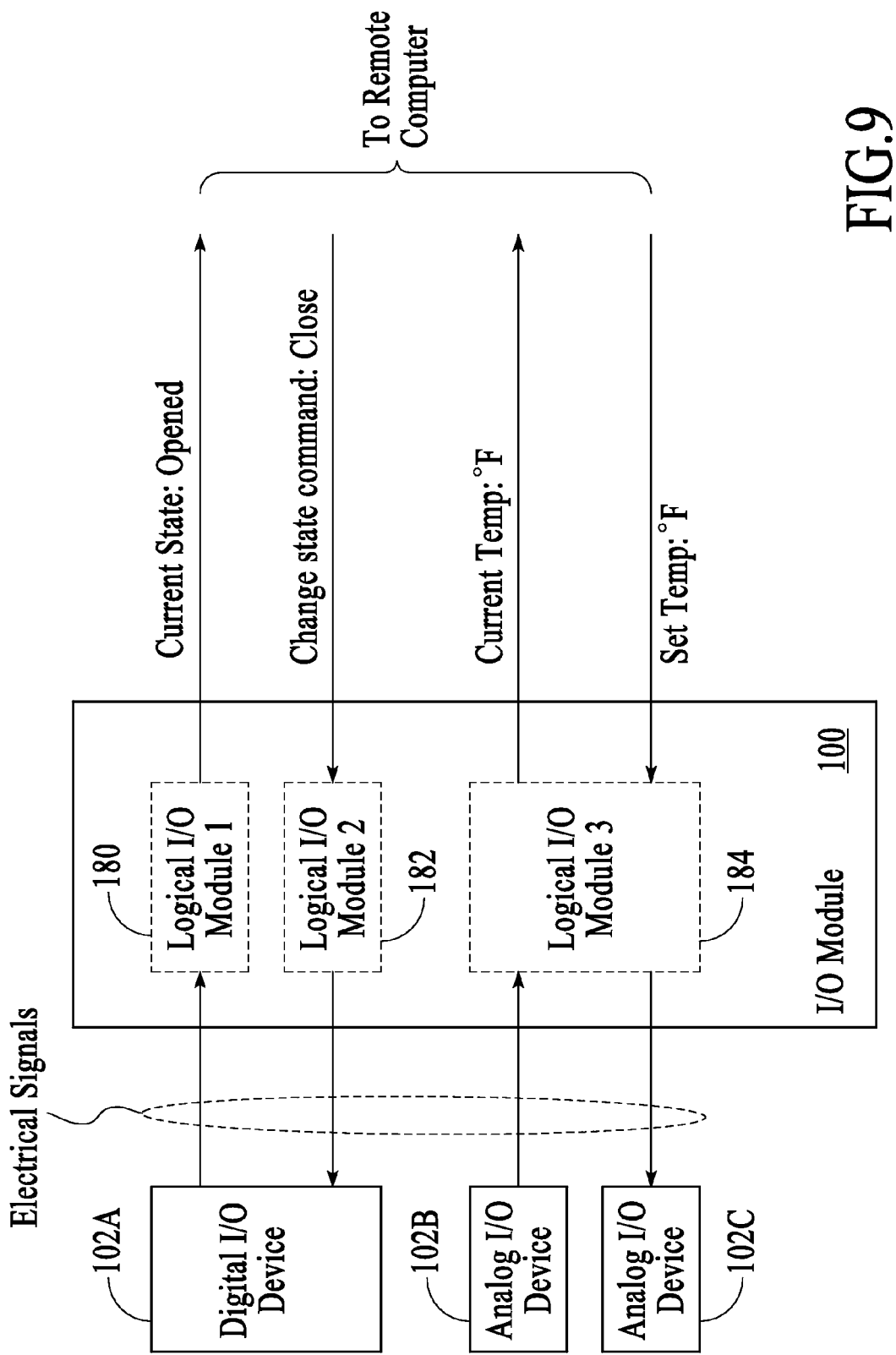
FIG. 9 is a functional block diagram of an I/O module that is configured with three different active logical I/O modules that support three different I/O devices in parallel.

Once an I/O module is configured to support an I/O device, a new I/O module is effectively created within the I/O module by the combination of the configured ASICs 108 and the device-specific software code that is executed by the microprocessor 110. Each new I/O module that is created is logically distinct from the other I/O modules and is therefore referred to as a "logical I/O module." Because the physical I/O module described above with reference to FIGS. 1 and 2 can be configured to support multiple different I/O devices in parallel, the physical I/O module can have multiple logical I/O modules active at the same time. FIG. 9 is a functional block diagram of an I/O module 100 that is configured with three different active logical I/O modules 180, 182, and 184 that support three different I/O devices 102A, 102B, and 102C in parallel. In the example of FIG. 9, I/O device 102A is a digital I/O device such as a valve. On the I/O device side of the I/O module, the valve outputs an electrical signal to logical I/O module 1 that indicates the state of the valve and logical I/O module 1 translates the signal to a meaningful output that is indicative of the current state of the valve, e.g., either "opened" or "closed." Logical I/O module 1 outputs the current state of the valve, e.g., either "opened" or "closed," to a remote computer. On the remote computer side of the I/O module, the remote computer provides a change state command to logical I/O module 2 of the I/O module, e.g., a command to either "open" the valve or "close" the valve. Logical I/O module 2 translates the change state command to an electrical signal that can change the state of the valve from "opened" to "closed" or from "closed" to "opened." In the example of FIG. 9, the current state of the valve is either "opened" or "closed" and the change state command is either "open" or "close."

I/O device 102B is an analog I/O device such as a thermocouple that is used to measure temperature. On the I/O device side of the I/O module 100, I/O device 102B outputs an analog electrical signal (e.g., a voltage) that is translated by logical I/O module 3 to a meaningful output expressed as the current temperature in degrees Fahrenheit. The current temperature is provided to the remote computer for remote temperature monitoring.

I/O device 102C is an analog I/O device such as a mass flow controller that is used to control the flow rate of a fluid, e.g., the flow rate of gas to a furnace. On the remote computer side of the I/O module 100, a user sets the desired temperature. A temperature setting is provided to logical I/O module 3 as a temperature in degrees Fahrenheit. Logical I/O module 3 then generates an output control signal for the mass flow controller in response to the measured current temperature and the temperature setting. The control signal for the mass flow controller can be generated according to a process control algorithm that is configured via the control interface.

In an embodiment, the I/O interface software 120 depicted in FIG. 2 can be updated as necessary, for example, to add new modules to support new I/O devices and/or to update existing modules. The above-described I/O module can be configured to operate simultaneously as an input and an output module or as any combination of input and/or output modules. Further, the I/O module can simultaneously support multiple different types of I/O devices.

Although the I/O module has been described as supporting pumps, valves, thermocouples, and mass flow controllers, the I/O module can be used to support other types of I/O devices, in particular, I/O devices that are used in industrial applications. Additional exemplary I/O devices that can be supported by the above-described I/O module include light bulbs, solenoid valves, relays, potentiometers, proximity sensors, switches, relay contacts, limit switches, push buttons, flasher, temperature controller, and a ModBus data device.

Figure 10:
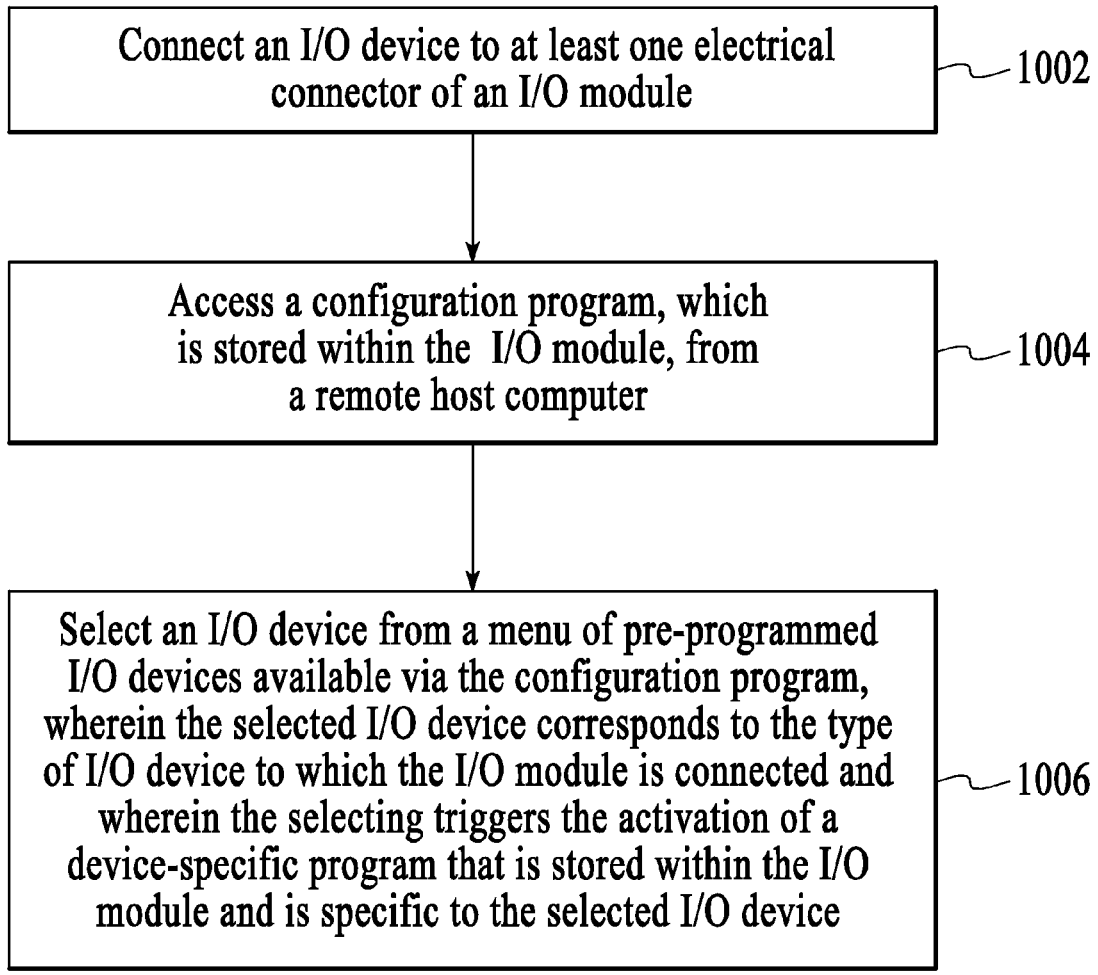
FIG. 10 is a process flow diagram of a method for configuring an I/O module for use with an I/O device in an industrial application.

FIG. 10 is a process flow diagram of a method for configuring an I/O module for use with an I/O device in an industrial application. At block 1002, an I/O device is connected to at least one electrical connector of an I/O module. At block 1004, a configuration program, which is stored within the I/O module, is accessed from a remote host computer. At block 1006, an I/O device is selected from a menu of pre-programmed I/O devices available via the configuration program, wherein the selected I/O device corresponds to the type of I/O device to which the I/O module is connected and wherein the selecting triggers the activation of a device-specific program that is stored within the I/O module and is specific to the selected I/O device.

As described above, the I/O module includes multiple ASICs that can receive electrical signals from the I/O device and/or generate electrical signals for the I/O device. In some applications, it may be desirable to distribute an electrical signal related to a connected I/O device to different ASICs within the I/O module. For example, it may be desirable to distribute an electrical signal, which is received from the I/O device on pin 1 of the I/O module, to pins 10 and 25 of the I/O module. The distribution of electrical signals between ASICs could be achieved by incorporating one or more "off-the-shelf" crosspoint switch chips onto the same printed circuit board (PCB) as the ASICs. Although it is possible to incorporate one or more off-the-shelf crosspoint switch chips onto the same PCB as the ASICs, the additional components add cost and complexity to the I/O module.

In accordance with an embodiment of the invention, matrix switches are incorporated into the ASICs that are described above with reference to FIG. 1. Matrix switches within the different ASICs are electrically connected by at least one signal path that is dedicated to electrical signal distribution. Additionally, the matrix switches are configurable on an ASIC-by-ASIC basis such that the desired signal distribution can be achieved in each I/O module. Incorporating configurable matrix switches into the ASICs enables electrical signals to be easily distributed among the ASICs in the I/O module.

Figure 11:
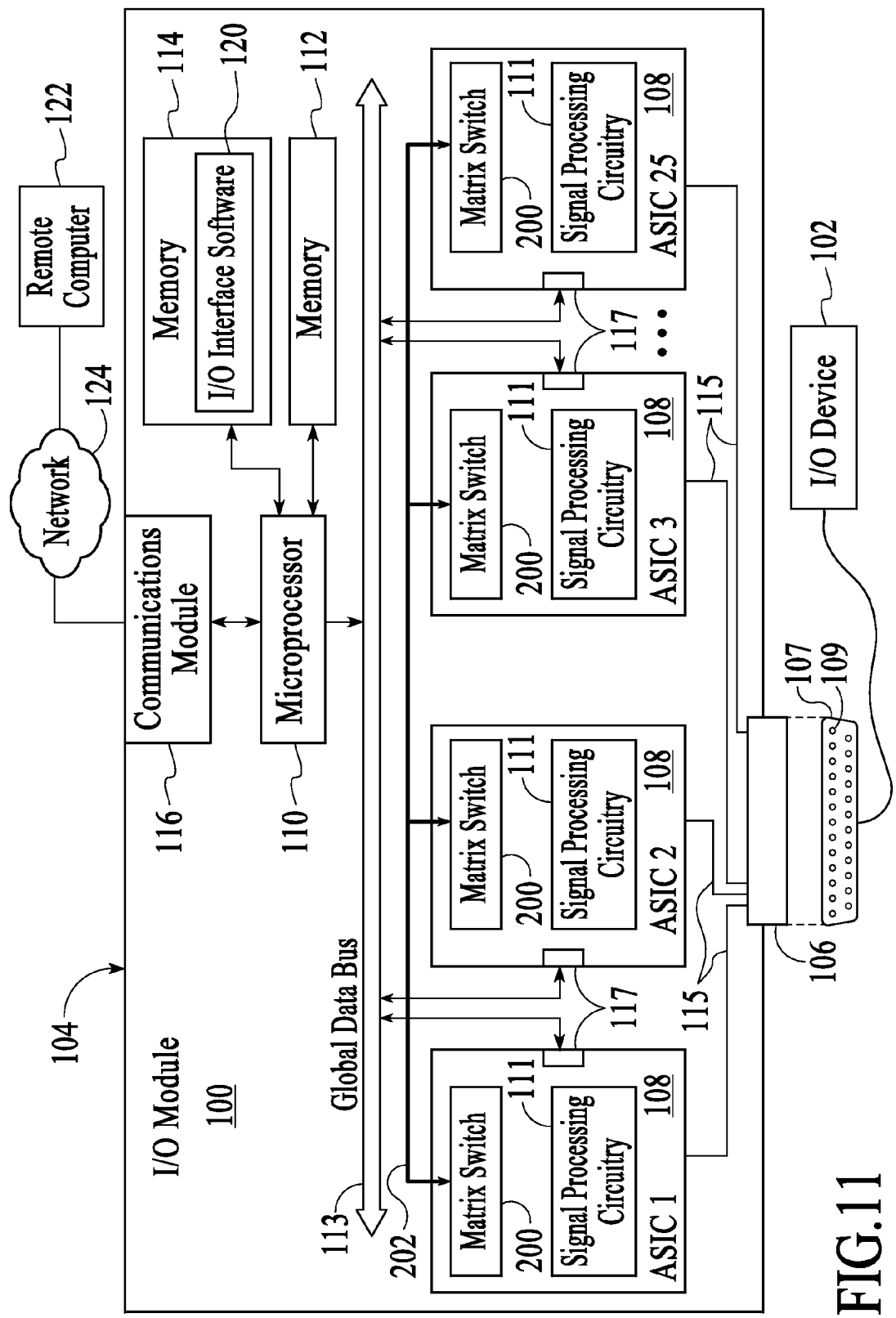
FIG. 11 depicts an embodiment of the I/O module from FIG. 1 that includes a matrix switch incorporated into each one of the ASICs.

FIG. 11 depicts an embodiment of the I/O module 100 from FIG. 1 that includes a matrix switch incorporated into each one of the ASICs 108. As depicted in FIG. 11, each ASIC includes the signal processing circuitry 111, the serial interface 117, and a matrix switch 200. The matrix switches of the ASICs are connected to each other by a signal path 202. Each matrix switch includes circuitry that enables configurable electrical signal connectivity between a set of inputs and a set of outputs.

Figure 12:
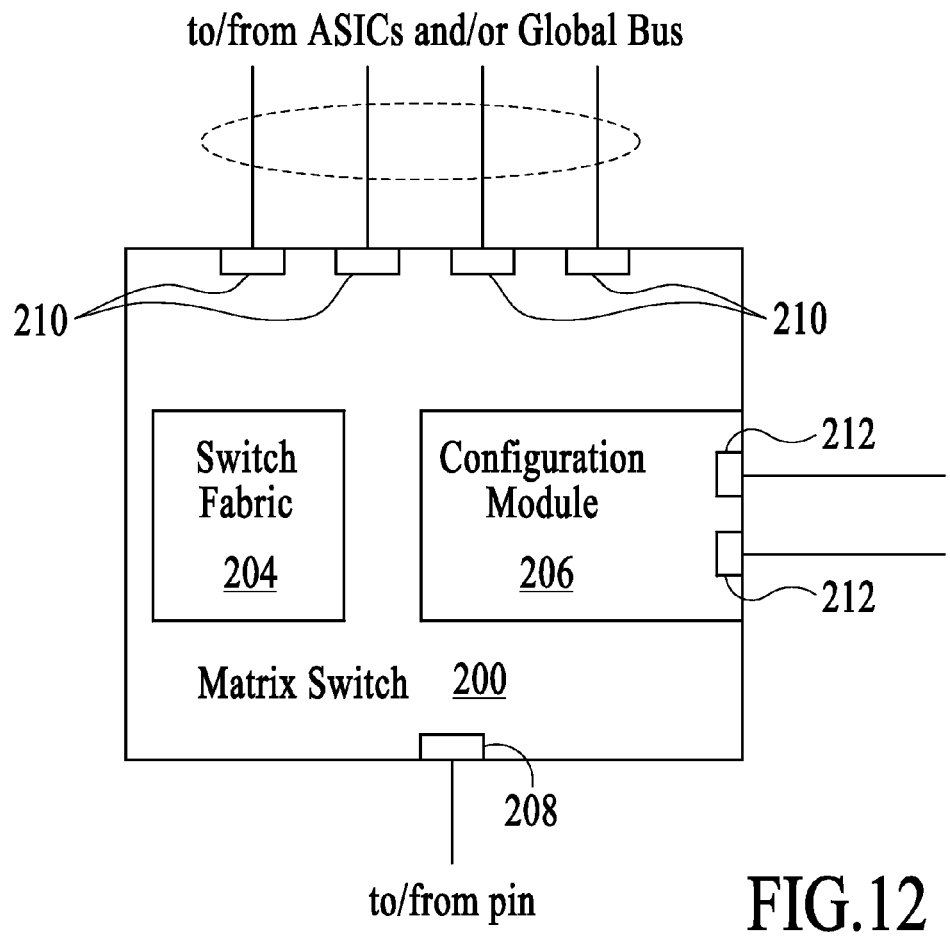
FIG. 12 depicts an expanded view of one of the matrix switches from FIG. 11.

FIG. 12 depicts an expanded view of a matrix switch 200 that includes a switch fabric 204, a configuration module 206, an electrical signal interface 208 to an electrical signal interface of the I/O module (e.g., to a pin), electrical signal interfaces 210 to the signal path that connects the matrix switches, and configuration interfaces 212. The switch fabric provides configurable electrical signal paths between the inputs and outputs and the configuration module provides the logic to process configuration commands that are received at the configuration interfaces. In an embodiment, each matrix switch is a crosspoint switch that includes a matrix grid of rows and columns of signal paths. The intersection points of the rows and columns can be connected by activating a switch at the desired signal path intersection. Although one embodiment of the matrix switch is a crosspoint switch, the matrix switch may utilize other switching techniques. In an embodiment, the signal path 202 between the matrix switches 200 includes multiple parallel signal paths between the matrix switches.

Referring back to FIG. 11, in an embodiment, the matrix switch 200 within each ASIC 108 is configured in response to configuration commands received via the respective serial interfaces 117. In particular, serial configuration commands generated by the microprocessor 110 are communicated to the ASICs through the global data bus 113 and the serial interfaces. Because the matrix switches are configured via the existing serial interfaces, no additional configuration interfaces need to be added to the ASICs to facilitate configuration of the matrix switches.

Figure 13:
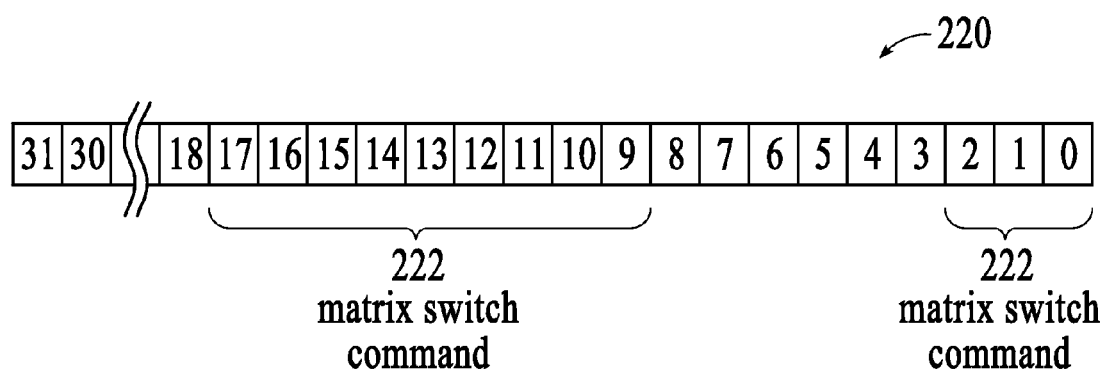
FIG. 13 depicts an embodiment of a serial command in which some of the bits are dedicated to carrying a matrix switch command.

In an embodiment, some bits of a serial command protocol are dedicated to configuration of the matrix switches. FIG. 13 depicts an embodiment of a 32-bit serial command 220 in which twelve bits (e.g., bits 0-2 and bits 9-17) are dedicated to carrying a matrix switch configuration command 222. Although in the embodiment of FIG. 13 the matrix switch configuration command is formed by two sets of non-continuous bits, in other embodiments, a matrix switch configuration command is formed by one continuous set of bits or more than two continuous sets of bits. Further, in another embodiment, the matrix switch command is carried in a stand alone serial command.

Using an I/O module that includes configurable matrix switches 200 incorporated into the ASICs 108 as described above with reference to FIG. 11, electrical signals destined for and/or received from an I/O device 102 can be distributed amongst the ASICs. Examples of electrical signal distribution via the matrix switches are described with reference to FIGS. 14-16. In each case, the matrix switches are configured via a matrix switch configuration command that is generated by the microprocessor 110. Typically, the configuration command is generated in response to a user interaction with the configuration interface (FIG. 2).

Figure 14:
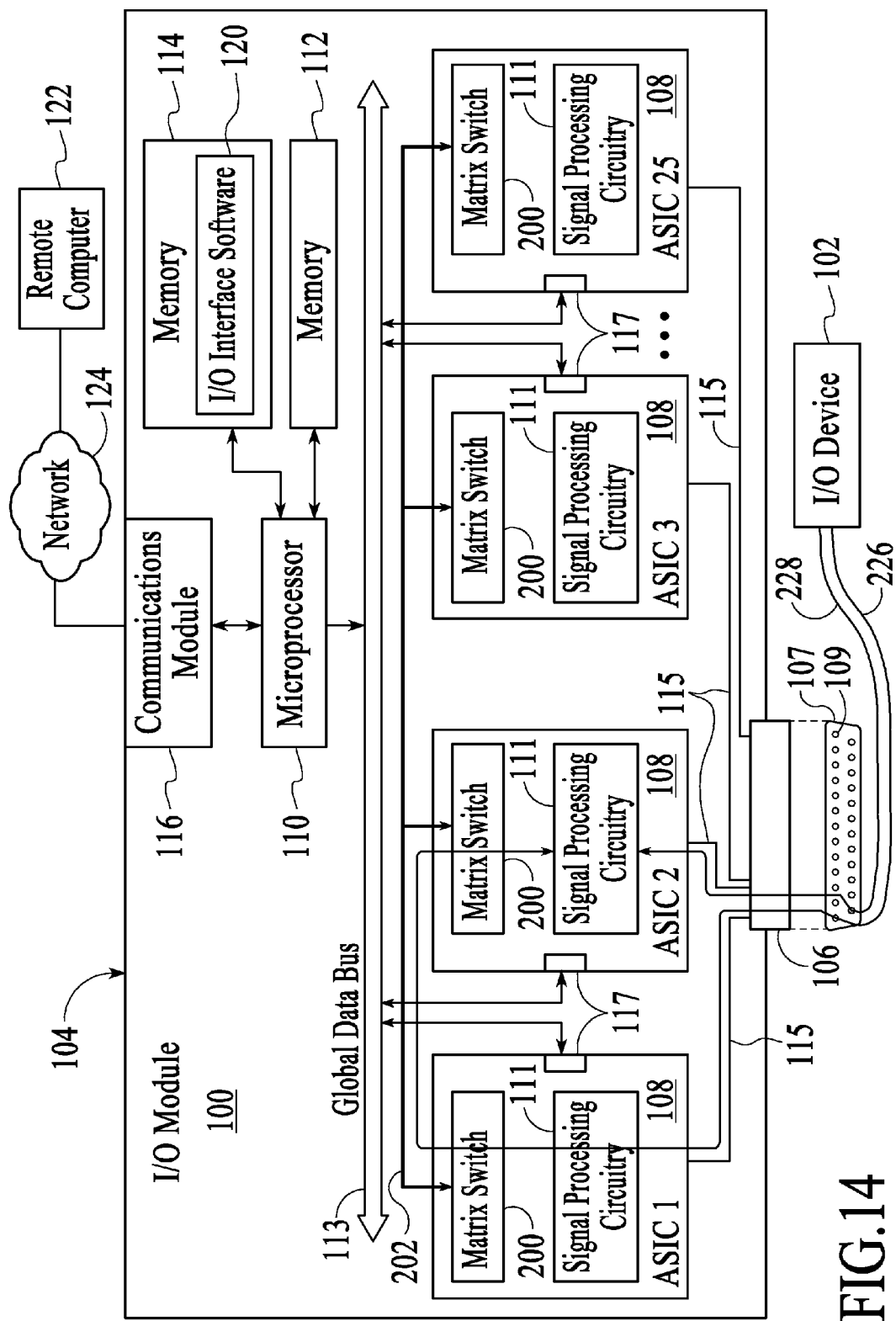
FIG. 14 depicts an example of an electrical signal that is distributed from ASIC 1 to ASIC 2 via the matrix switches.

FIG. 14 illustrates an example of an electrical signal 226 that is distributed from ASIC 1 to ASIC 2. In the example of FIG. 14, the I/O device 102, such as a thermocouple, provides two electrical signals 226 and 228 to the I/O module 100. For example, two electrical signals of different voltage are provided to the I/O module via two different pins of the I/O module. The two different electrical signals are typically measured as a voltage differential. In order to measure the voltage differential of the two electrical signals, the electrical signal received at ASIC 1 (pin 1) is distributed to ASIC 2 and the voltage differential between the two electrical signals is measured by the signal processing circuitry within ASIC 2. The electrical signal distribution is achieved by configuring the matrix switch within ASIC 1 to distribute the electrical signal on a first signal path and by configuring the matrix switch within ASIC 2 to receive the signal on the same signal path. Because electrical signals are able to be distributed to different ASICs within the I/O module via the matrix switches, different signal processing operations such as a differential signal measurement can be easily facilitated.

Figure 15:
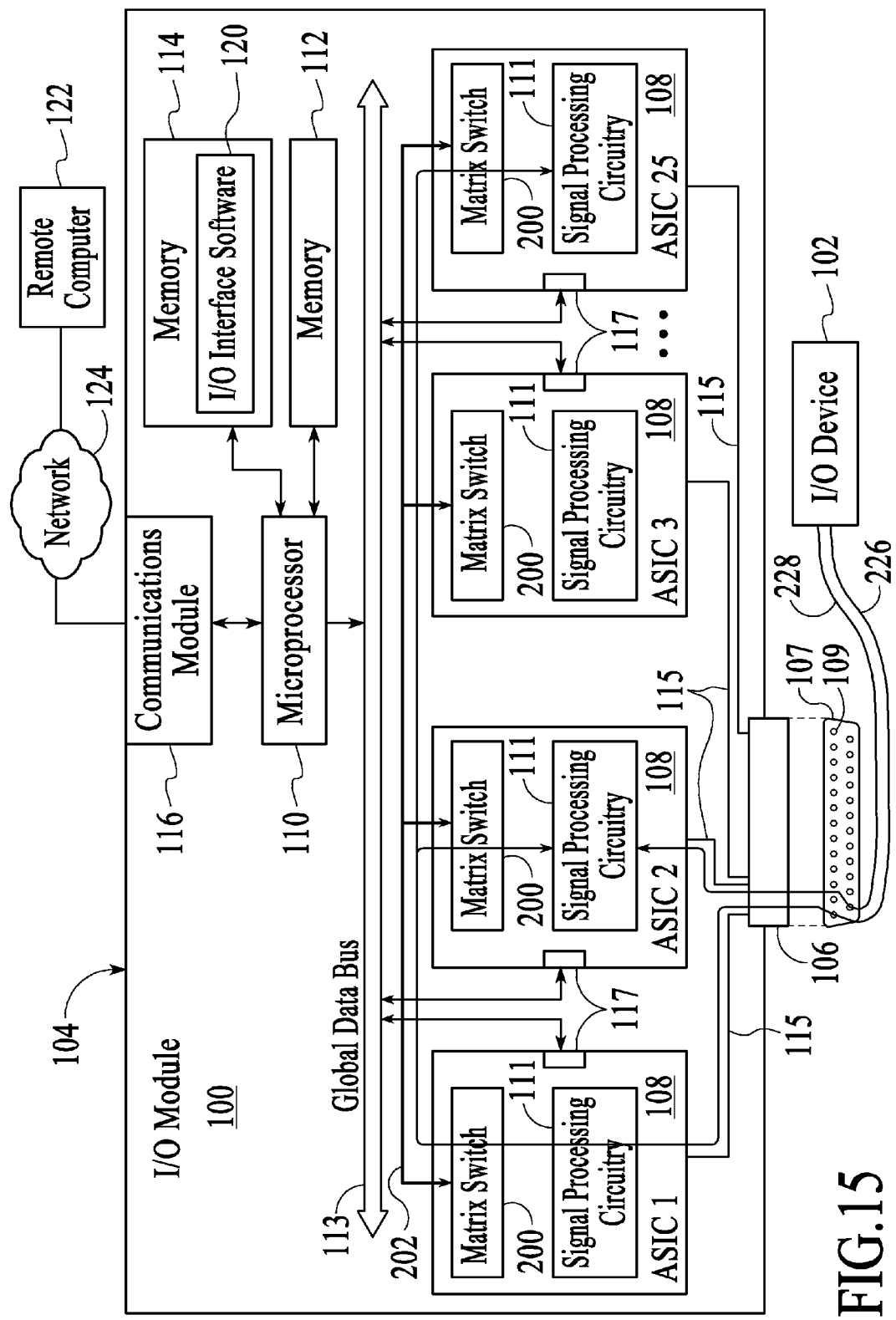
FIG. 15 depicts an example of an electrical signal that is distributed from ASIC 1 to multiple other ASICs via the matrix switches.

In the example of FIG. 14, the electrical signal 226 from ASIC 1 is distributed only to one other ASIC (ASIC 2). The distribution of electrical signals using the above-described technique is not limited only to one other ASIC. FIG. 15 depicts an example of an electrical signal 226 that is distributed from ASIC 1 to multiple other ASICs via the matrix switches 200. In particular, the electrical signal received at ASIC 1 is distributed to ASIC 2 and to ASIC 25.

Figure 16:
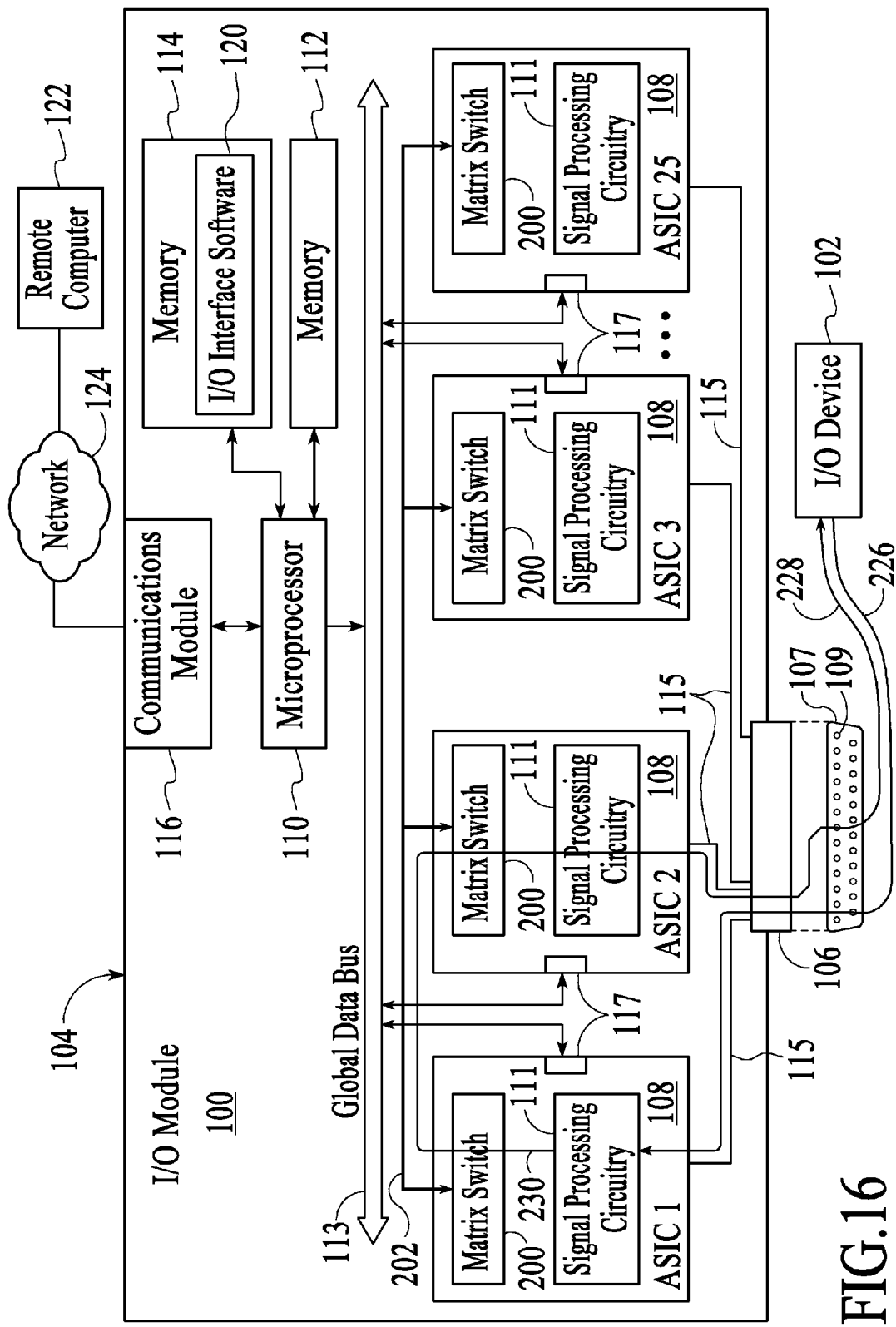
FIG. 16 depicts an example of an electrical signal that is generated at an ASIC within the I/O module, distributed to another ASIC within the I/O module, and then provided to the I/O device via the pin associated with the other ASIC.

The examples of FIGS. 14 and 15 depict cases in which an electrical signal received at the I/O module 100 from the I/O device 102 is distributed to different ASICs 108 within the I/O module. FIG. 16 depicts an example of an electrical signal 230 that is generated at an ASIC within the I/O module, distributed to another ASIC within the I/O module, and then provided to the I/O device via the pin associated with the other ASIC. In the example of FIG. 16, an electrical signal 230 is generated at ASIC 1 and then provided to ASIC 2. An electrical signal 232 is also generated at the I/O device and provided to ASIC 1. In an embodiment, the electrical signal that is distributed to ASIC 2 is generated in response to the electrical signal that is received from the I/O device at ASIC 1 although this is not required. The electrical signal that is generated at ASIC 1 is distributed to ASIC 2 via the matrix switches and the signal path that connects the two matrix switches. From ASIC 2, the electrical signal is provided to the I/O device through the corresponding electrical signal interface (e.g., pin 2).

Although some examples of electrical signal distribution between the ASICs are described with reference to FIGS. 14-16, other distribution arrangements are possible. Further, although examples of the distribution of electrical signals received from the I/O device or generated by the I/O module are depicted separately, the distribution of externally received and internally generated electrical signals can occur simultaneously.

Figure 17:
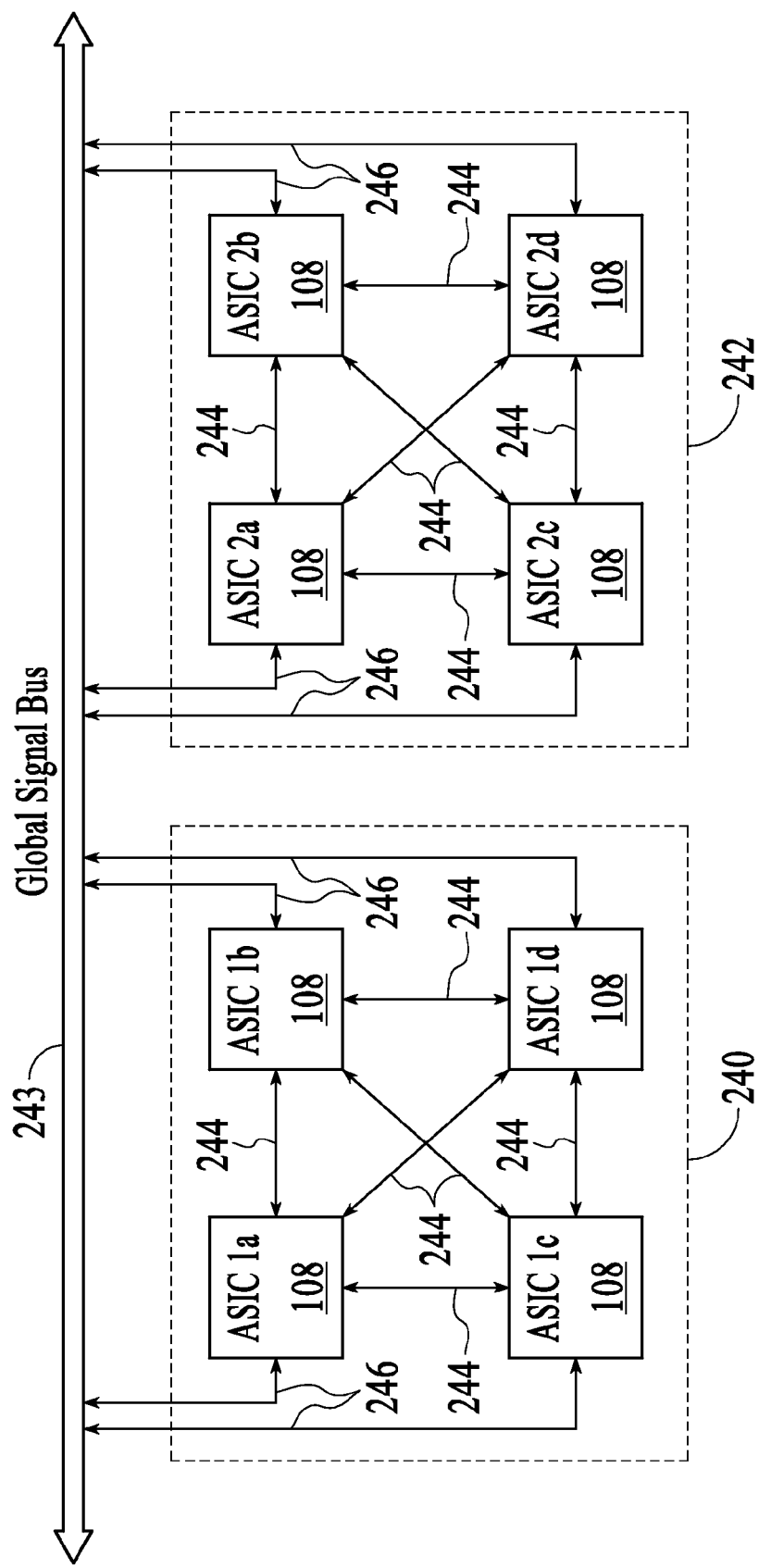
FIG. 17 depicts the ASICs of an I/O module that are clustered into two different groups of four ASICs.

In another embodiment, electrical signal connectivity between ASICs is established on a per-group basis. For example, ASICs are clustered into groups within the I/O module and electrical signal paths are provided between the ASICs within each group and between the groups. FIG. 17 depicts the ASICs 108 of an I/O module (not shown) that are clustered into two different groups 240 and 242 of four ASICs. Each ASIC includes a matrix switch (not shown) as described above and electrical signal connectivity between each ASIC in a group is provided via group-specific signal paths 244. Electrical signal connectivity between the groups is provided via signal paths 246 and a main electrical signal path such as a global signal bus 243. In an alternative embodiment, one of the ASICs in each group provides the interface to the global signal bus. Clustering the ASICs into groups can reduce the complexity of the circuit board design by reducing the number of signal paths required to provide complete mesh connectivity. This clustering technique provides a tradeoff between complexity and flexibility.

In an embodiment, the global signal bus 243 can only be used by one ASIC at a time. For example, while ASIC 1a connects to ASIC 2a via the global signal bus, ASIC 2d cannot use the bus to connect to ASIC 1b, or any other ASIC in the "a" group of ASICs 240. In an embodiment, an ASIC can use the global signal bus to distribute a signal to more than one ASIC. For example, ASIC 1a can "broadcast" a signal to all other ASICs via the global signal bus. In an embodiment, ASICs are grouped into groups that correspond to neighboring pins 109 of the connector 106 (FIG. 11). For example, in DB-25 connector, each pin has four surrounding pins that are referred to as "neighboring pins," with the exception of the pins at both ends of the connector. In an embodiment, the ASICs are grouped into groups of four ASICs, with the groups corresponding to the groups of four neighboring pins.

Figure 18:
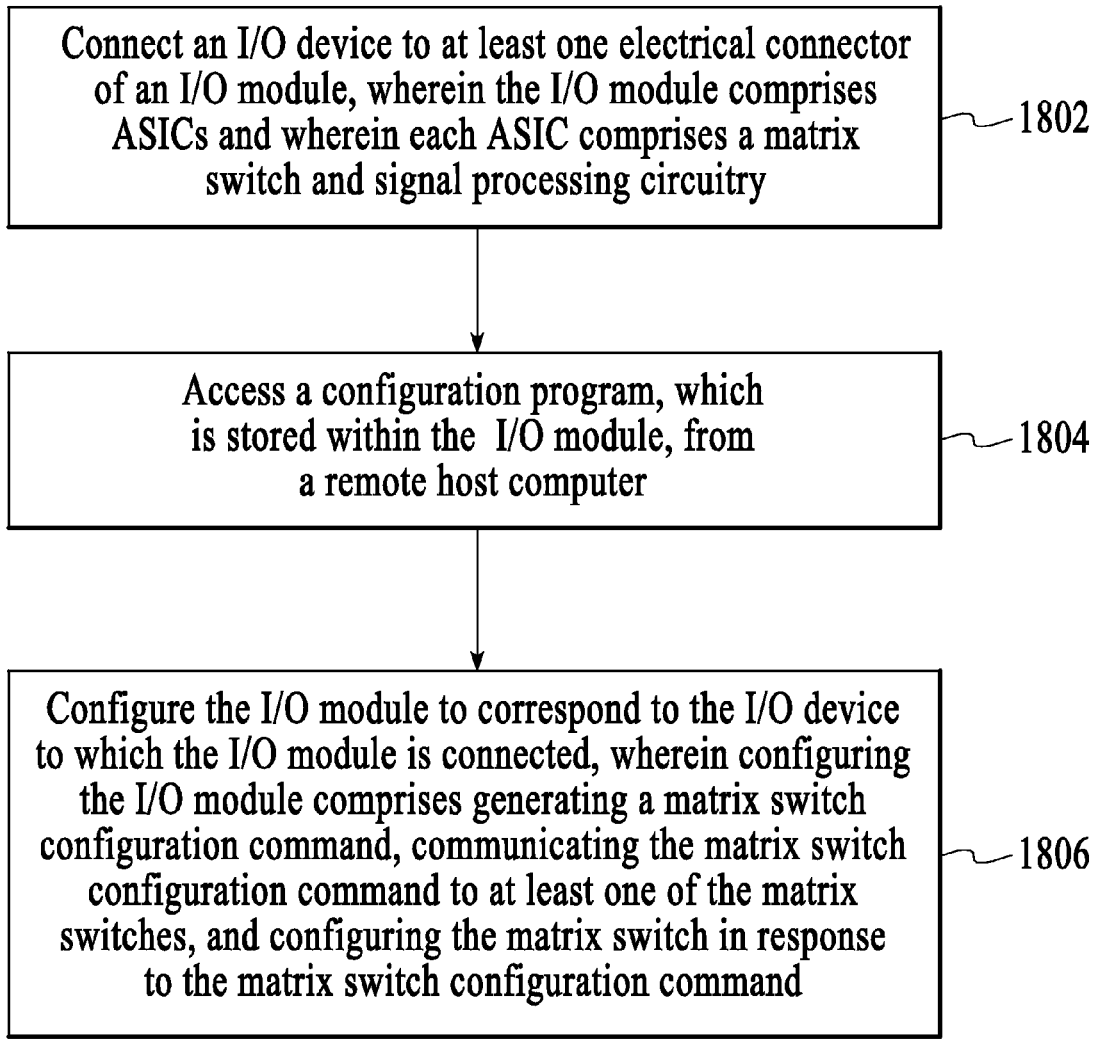
FIG. 18 is a process flow diagram of a method for configuring an I/O module for use with an I/O device in an industrial application.

FIG. 18 is a process flow diagram of a method for configuring an I/O module for use with an I/O device in an industrial application. At block 1802, an I/O device is connected to at least one electrical connector of an I/O module, wherein the I/O module comprises application-specific integrated circuits (ASICs) and wherein each ASIC comprises a matrix switch and signal processing circuitry. At block 1804, a configuration program, which is stored within the I/O module, is accessed from a remote host computer. At block 1806, the I/O module is configured to correspond to the I/O device to which the I/O module is connected, wherein configuring the I/O module comprises generating a matrix switch configuration command, communicating the matrix switch configuration command to at least one of the matrix switches, and configuring the matrix switch in response to the matrix switch configuration command.

Although specific embodiments of the invention have been described and illustrated, the invention is not to be limited to the specific forms or arrangements of parts as described and illustrated herein. The invention is limited only by the claims.

What is claimed is:

1. An input/output (I/O) module for interfacing with an I/O device used in an industrial application, the I/O module comprising:
   a housing;
   an electrical connector, accessible from outside the housing, for connecting the I/O module to at least one I/O device, the electrical connector comprising multiple electrical signal interface pins for making an electrical signal connection between the at least one I/O device and the I/O module;
   within the housing, a different application-specific integrated circuit (ASIC) associated with each one of the electrical signal interface pins, wherein each of the ASICs comprises a matrix switch and signal processing circuitry configured to process signals related to the at least one I/O device;
   wherein the ASICs further comprise a serial interface and wherein the matrix switches are configurable in response to a matrix switch configuration command received at the serial interface;
   within the housing, electrical signal paths between the ASICs and the electrical signal interface pins; and
   within the housing, electrical signal paths between the matrix switches of the ASICs that provide electrical signal connectivity between the matrix switches of each ASIC in the I/O module and that enable electrical signals to be distributed to any of the different ASICs depending on the configuration of the matrix switches.

2. The I/O module of claim 1 wherein the I/O module further comprises a microprocessor configured to generate matrix switch configuration commands.

3. The I/O module of claim 2 further comprising a data bus between the microprocessor and the serial interface over which the matrix switch configuration commands can be communicated.

4. The I/O module of claim 3 wherein the signal processing circuitry is configured in response to a configuration command received via the serial interface.

5. The I/O module of claim 1 wherein the ASICs are organized into different groups, wherein the ASICS within a group are electrically connected via group-specific signal paths and wherein the groups are connected via a global signal bus.

6. The I/O module of claim 1 further comprising a microprocessor and memory within the housing, the memory having computer readable program code stored thereon, which when executed by the microprocessor allows a user to remotely configure the I/O module to support an I/O device by selecting an I/O device from a menu of pre-programmed I/O devices.

7. The I/O module of claim 6 wherein the computer readable program code comprises configuration options for multiple different types of I/O devices.

8. The I/O module of claim 6 wherein the computer readable program code enables the I/O module to be configured to correspond to multiple different I/O devices in parallel.

9. The I/O module of claim 6 wherein the computer readable program code comprises computer readable program code for individually configuring the ASICs to correspond to a particular I/O device.

10. The I/O module of claim 6 wherein the computer readable program code comprises a graphical user interface that enables a user to configure the I/O module and to monitor a parameter of the I/O device from a remote computer.

11. The I/O module of claim 6 wherein the computer readable program code enables a user to configure an I/O device directly from a web browser.

12. The I/O module of claim 6 further comprising a communications module configured to enable communication between the I/O module and a remote computer.

13. An input/output (I/O) module for interfacing with an I/O device used in an industrial application, the I/O module comprising:
   a housing;
   an electrical connector, accessible from outside the housing, for connecting the I/O module to at least one I/O device, the electrical connector comprising multiple electrical signal interface pins for making an electrical signal connection between the at least one I/O device and the I/O module;
   within the housing, a different application-specific integrated circuit (ASIC) associated with each one of the electrical signal interface pins, wherein each of the ASICs comprises a matrix switch and signal processing circuitry configured to process signals related to the at least one I/O device;
   within the housing, electrical signal paths between the ASICs and the electrical signal interfaces; and
   within the housing, an electrical signal path between the matrix switches of the ASICs, wherein the electrical signal path between the matrix switches provides electrical signal connectivity between the matrix switches of each ASIC in the I/O module;
   wherein the ASICs further comprise a serial interface and wherein the matrix switches are configurable in response to a matrix switch configuration command received at the serial interface;

within the housing, a microprocessor and memory, the memory having computer readable program code stored thereon, which when executed by the microprocessor allows a user to configure the I/O module to support an I/O device.

14. A method for configuring an input/output (I/O) module for use with an I/O device in an industrial application, the method comprising:

connecting an I/O device to at least one electrical connector of an I/O module, wherein the I/O module comprises a different application-specific integrated circuit (ASIC) associated with each pin of the at least one electrical connector and wherein each ASIC comprises a matrix switch and signal processing circuitry;

accessing a configuration program, which is stored within the I/O module, from a remote host computer; and configuring the I/O module to correspond to the I/O device to which the I/O module is connected, wherein configuring the I/O module comprises:
  generating a matrix switch configuration command;
  communicating the matrix switch configuration command to at least one of the matrix switches; and
  configuring the matrix switch in response to the matrix switch configuration command to distribute an electrical signal from a first ASIC to a second ASIC.

* * * * *